United States Patent [19]
Freyman et al.

[11] Patent Number: 6,028,756
[45] Date of Patent: Feb. 22, 2000

[54] USING TOPOLOGICAL FEATURES TO LOWER THE BLOWING CURRENT NEEDED FOR FUSES

[75] Inventors: Ronald Lamar Freyman, Bethlehem; Bruce Walter McNeill, Allentown; Malcolm Harold Smith, Macungie; Gary H. Weiss, Slatington; Charles Raymond Miller, Shickshinny, all of Pa.

[73] Assignee: Lucent Technologies, Inc., Murray Hill, N.J.

[21] Appl. No.: 09/041,543

[22] Filed: Mar. 11, 1998

[51] Int. Cl.[7] .............................. H02H 5/04; H01L 23/48
[52] U.S. Cl. ..................... 361/104; 438/13; 438/132; 438/281; 438/467; 257/774
[58] Field of Search ....................... 361/103, 104; 257/50, 208, 209, 529, 774, 775; 438/6, 13, 54, 128, 130–132, 215, 281, 466, 467, 469, 482, 668, 934, 424, 427

[56] References Cited

U.S. PATENT DOCUMENTS

| | | | |
|---|---|---|---|
| 4,536,949 | 8/1985 | Takayama et al. | 29/578 |
| 5,235,335 | 8/1993 | Hester et al. | 341/172 |
| 5,353,028 | 10/1994 | de Wit et al. | 341/172 |
| 5,552,338 | 9/1996 | Nang | 437/170 |

OTHER PUBLICATIONS de Wit et al., A Low–Power 12–b Analog–to–Digital Converter with On–Chip Precision Trimming IEEE Journal of Solid–State Circuits, vol. 28, No. 4, Apr. 1993, pp. 455, 458–461.

Gene Vance, Post–Package Trim Increases IC Reliability, Electronic Engineering Times Sep. 8, 1997, p. 70.

Gail Robinson, PROM Fuse Design Scales to Sub–0.25 Micron, Electronic Engineering Times, Sep. 29, 1997, p. 44.

*Primary Examiner*—Ronald W. Leja

[57] ABSTRACT

An integrated circuit includes topological features for weakening or otherwise modifying a blowable fuse in order to decrease the current needed to blow the fuse. This allows a decrease in the size of the circuit components which are needed to supply the current for blowing the fuse, in turn allowing compaction of the layout of the circuitry needed to blow the fuse. To this end, topological features are used to deform the shape of or otherwise modify the fuse, in turn increasing the resistance of the fuse or introducing flaws that allow the fuse to blow at a lower current.

24 Claims, 3 Drawing Sheets

USING TOPOLOGICAL FEATURES TO LOWER THE BLOWING CURRENT NEEDED FOR FUSES

TECHNICAL FIELD

The present invention is generally directed to the field of programmable fuses for use with integrated circuitry, and in particular, to compaction of the layout of the circuitry needed to operate (blow) a programmable fuse.

BACKGROUND OF THE INVENTION

Blowable fuses have been used in a variety of applications to control the operative features of an integrated circuit. For example, such fuses have been used for the correction of bandgap references and data converters. Usually, this is done at the wafer probe stage and requires the use of substantial off-chip equipment.

In practice, such techniques have been found to be subject to certain limitations. One such limitation is that it is often desirable to operate upon the fuses not only at the wafer-probe stage, but also later, following packaging. Other limitations result from the amount of power which is required to operate (blow) such fuses. For example, the switching element provided on the integrated circuit for blowing the fuse must in practice occupy on the order of one-half of the total area of the blowable fuse circuit. Primarily, this is because the size of the switching element which is used to blow the fuse is responsive to the amount of current required to open the fuse, which continues to present a significant limitation. In addition, the amount of power required to blow the fuse has in practice been found to be potentially damaging to the passivation layer of the integrated circuit, which can permit the passage of moisture and the corrosion which can result from such moisture.

Efforts have been made to overcome these limitations. For example, De Wit et al., "A Low-Power 12-b Analog-to-Digital Converter with On-Chip Precision Trimming", IEEE Journal of Solid-State Circuits, Vol. 28, No. 4 (April, 1993), discloses the use of blowable fuses to reduce the capacitor ratio error in a data converter circuit. Circuits for accomplishing this are further described in U.S. Pat. Nos. 5,353,028 and 5,235,335. In an effort to allow programmable, on-chip adjustments to be performed after packaging, and at a lower voltage (power) level, De Wit et al. suggest the use of polysilicon fuses.

While such measures have offered some improvement upon the use of blowable fuses, still further improvement is considered necessary. In all cases, it remains important to ensure that such fuses are both safely and reliably blown. Moreover, the need for further reduction in the area occupied by such circuitry continues to be driven by the desire to provide a given integrated circuit with a greater number of fuses.

SUMMARY OF THE INVENTION

In accordance with the present invention, these problems are solved by providing a blowable fuse for an integrated circuit which includes topological features for weakening or otherwise modifying the fuse in order to decrease the current needed to blow the fuse. This has been found to allow a decrease in the size of the transistor and the power rails needed to supply the current for blowing the fuse, in turn allowing compaction of the layout of the circuitry needed to blow the programmable fuse.

When attempting to blow fuses with circuitry provided on the integrated circuit, the primary factor affecting the size of such circuitry, and the power rails, has been found to be the amount of current needed to blow the fuse. The smaller the current, the smaller the circuit which is required. However, the width of the fuse is constrained to be greater than the minimum geometry possible, and the minimum current required to blow the fuse is correspondingly set by this geometry. In accordance with the present invention, this practical limitation is overcome by the use of topological features to deform the shape of or otherwise modify the fuse, in turn increasing the resistance of the fuse or introducing flaws that allow the fuse to blow at a lower current. The use of topological features around the fuse will also tend to make it more difficult to see whether or not the fuse has been blown, making the fuse more secure in applications where security is required.

DETAILED DESCRIPTION OF PREFERRED EMBODIMENTS

Figure 1:
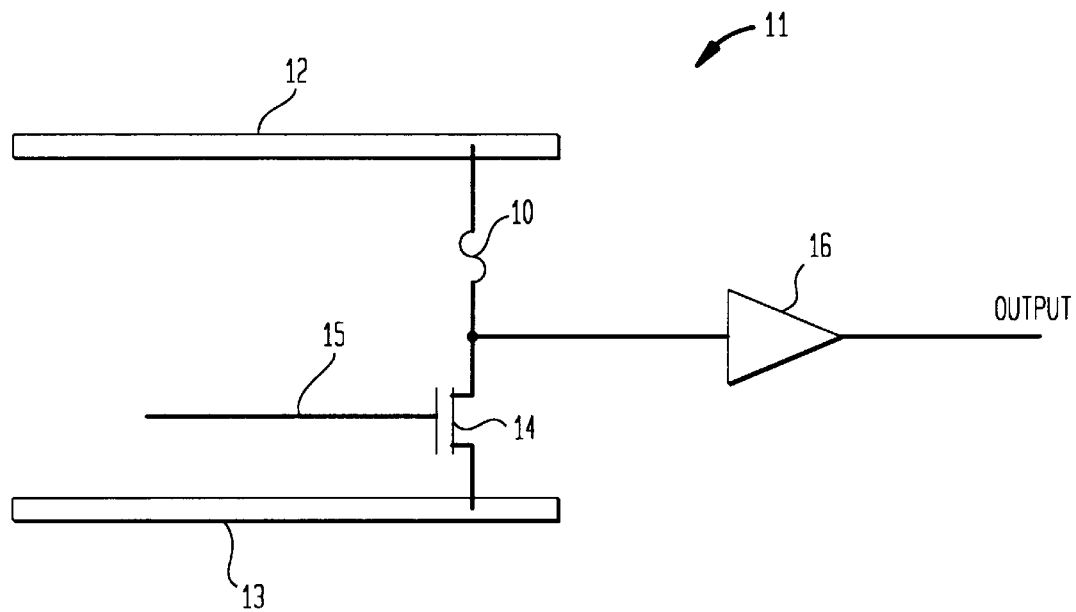
FIG. 1 is a schematic diagram of a fuse and its related control circuitry.

FIG. 1 is a schematic of a circuit including a programmable fuse 10 and associated circuitry 11 for controlling operations of the fuse 10. Initially, the fuse 10 is intact and capable of conducting a current (i.e., in a "closed" state). The state of the fuse 10 is changed responsive to operation of the circuitry 11. To this end, a current is caused to flow between a power rail 12 and a ground rail 13 responsive to the control of a transistor 14. When it becomes desirable to change the state of the fuse 10 (i.e., to an "open" state), the fuse 10 is "blown" by shorting-circuiting the fuse 10 through the transistor 14 responsive to a control signal, at 15. In operation, the state of the fuse 10 is read using a sense amplifier 16.

The major factor determining the size of the circuitry 11 is the amount of current required to blow the fuse 10. As a consequence, the transistor 14, the power rail 12 and the ground rail 13 must be sufficiently large to be able to handle the current needed for this operation to take place.

In accordance with the present invention, it has been found that by using topological features in contact with the fuse 10 (including features located around, under and over the fuse), it is possible to alter the characteristics of the fuse 10 in such a way that the current needed to blow the fuse 10 can be decreased. This, in turn, permits correspondingly smaller circuitry 11 to be used for purposes of blowing the fuse 10, primarily a smaller transistor 14, power rail 12 and ground rail 13. By reducing the size of these several components, the integrated circuit provided with such components can accept more fuses and give a better yield per unit area.

Any of a variety of topological features surrounding the fuse 10 may be used to modifying the characteristics of the fuse 10. Examples of this are given below, with the understanding that the several embodiments to be described are given only as examples of the many modifications which may be used to implement the improvements of the present invention.

Figure 2A:
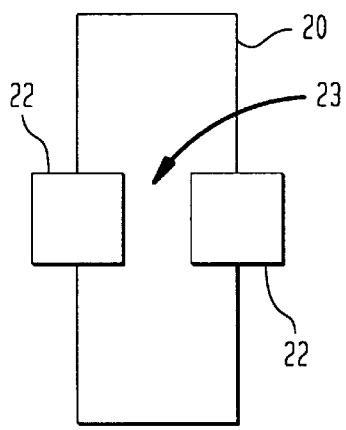
FIG. 2A is a top plan view of a fuse having portions which are modified in accordance with the present invention using via holes.
Figure 2B:
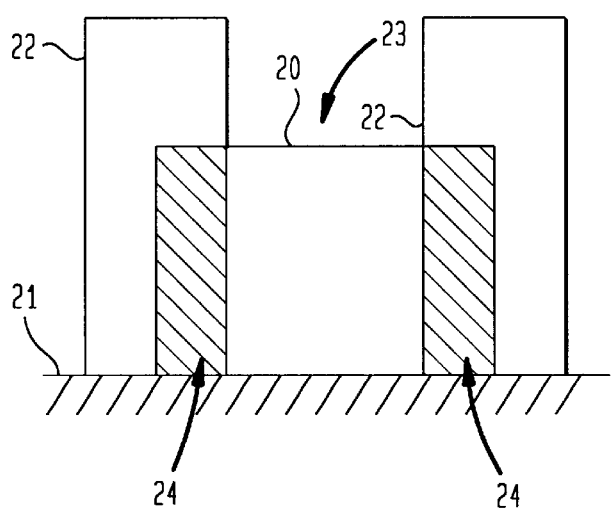
FIG. 2B is a schematic, cross-sectional view of the fuse of FIG. 2A.

FIGS. 2A and 2B show a fuse 20 formed on a base layer 21 using techniques which are otherwise conventional and known in the industry. In this embodiment, a pair of via (or contact) holes 22 are formed adjacent to the fuse 20 so that the via holes 22 intersect with selected portions of the fuse 20. As a result of the processes which are used to manufacture the integrated circuit with which the fuse 20 is associated (the so-called "legal" processes), a narrowed portion 23 is formed in the fuse 20 between the via holes 22. The amount of narrowing which results from this process (shown at 24 in FIG. 2B) can be varied and carefully controlled, and modifies the fuse 20 at the narrowed portion 23 in such a way that the fuse 20 can be operated (i.e., opened) with a current which is reduced from the amount of current which would have been required to open the fuse 20 in an unmodified condition. The via holes 22 can have any of a variety of shapes and sizes, and can be formed in different ways, as preferred, to produce narrowed portions 23 of the desired shape, size and number.

Figure 3:
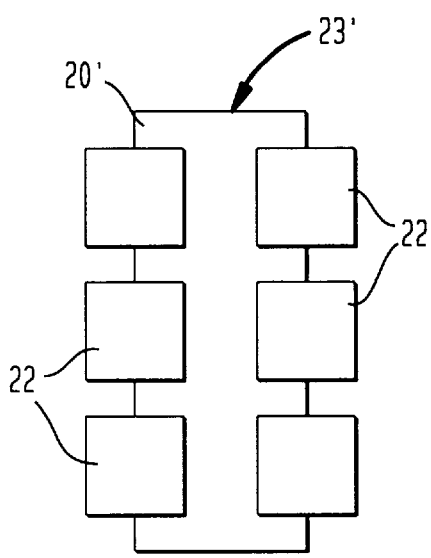
FIGS. 3 to 5 are top plan views of alternative embodiment fuses having portions which are modified in accordance with the present invention using via holes.
Figure 4:
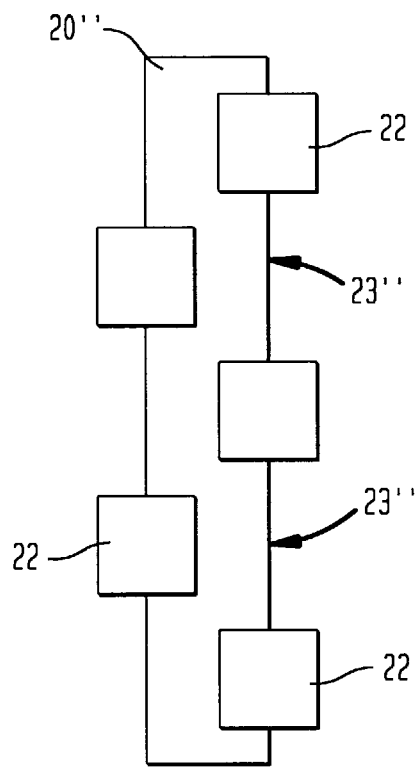
Figure 5:
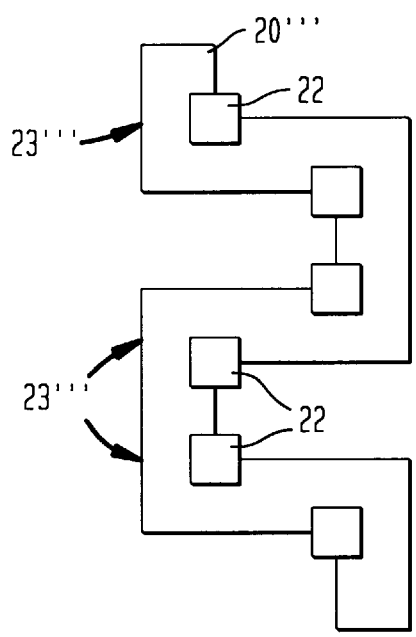

FIGS. 3 to 5 show alternative embodiment fuses 20', 20", 20''', each having a series of via holes 22 for modifying the fuses 20', 20", 20''' to form the narrowed portions 23', 23", 23''', respectively, and in this way reduce the amount of current which would have been required to open the fuses 20', 20", 20''' in an unmodified condition.

Figure 6A:
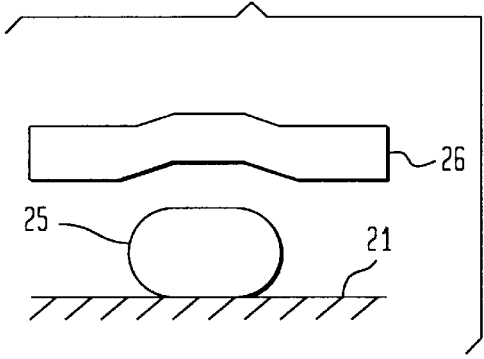
FIG. 6A is a schematic, cross-sectional view of a fuse having portions which are structurally modified in accordance with the present invention.
Figure 6B:
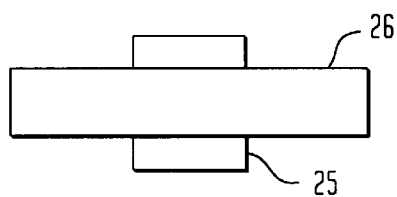
FIG. 6B is a top plan view of the fuse of FIG. 6A.

FIGS. 6A and 6B illustrate the use of a structural feature to modify the characteristics of a fuse in order to reduce the amount of current which is required to open the fuse. In this embodiment, a feature 25 is formed on the base layer 21 so that the feature 25 is located below the fuse layer 26. The feature 25 runs perpendicular to, and under the fuse layer 26, causing the fuse to ride up on the feature 25 (and the base layer 21). This creates a weakness in the fuse at that point, in turn increasing the resistance developed across the fuse and correspondingly decreasing the amount of current needed to blow the fuse. The feature 25 can have any of a variety of shapes and sizes, and can proceed at varying angles relative to the fuse layer 26, as preferred.

Figure 7A:
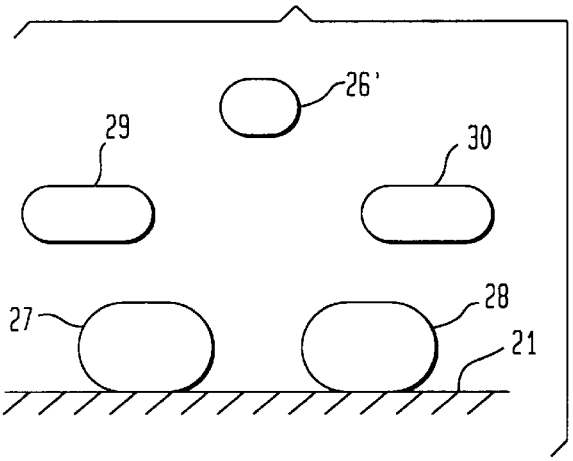
FIG. 7A is a schematic, cross-sectional view of an alternative embodiment fuse having portions which are structurally modified in accordance with the present invention.
Figure 7B:
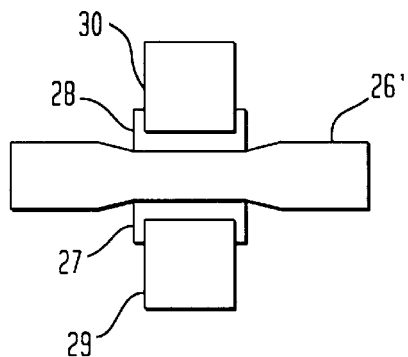
FIG. 7B is a top plan view of the fuse of FIG. 7A.

FIGS. 7A and 7B show the use of plural features 27, 28, 29, 30 provided on the base layer 21. The several features 27, 28, 29, 30 again run below the fuse layer 26', in this case creating a valley for receiving the fuse. In this way, the width of the fuse is decreased, in turn increasing the resistance developed across the fuse and correspondingly decreasing the amount of current needed to blow the fuse. As with the feature 25, the several features 27, 28, 29, 30 can have any of a variety of shapes and sizes, and can proceed at varying angles relative to the fuse layer 26', as preferred.

Figure 8A:
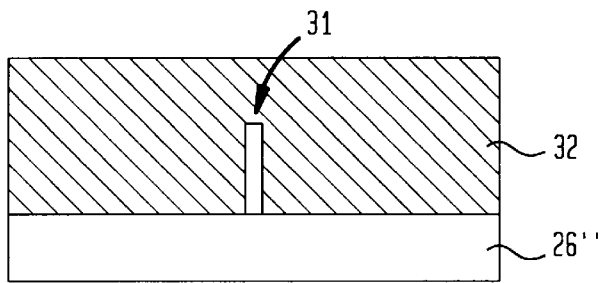
FIG. 8A is a schematic, cross-sectional view of a fuse having portions which are exposed to a via hole to modify characteristic features of the fuse in accordance with the present invention.
Figure 8B:
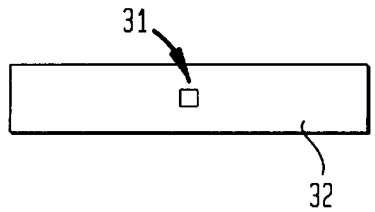
FIG. 8B is a top plan view of the fuse of FIG. 8A.

FIGS. 8A and 8B show the use of a via or contact hole 31 (with no metallization) provided above the fuse layer 26", which gives the material of the fuse an escape route capable of lowering the energy needed to blow the fuse. The hole 31 is advantageously made in a glass covering 32 formed over the fuse layer 26". Again, the hole 31 can have any of a variety of shapes and sizes, and can be formed in different ways, as preferred. Plural holes 31 can also be provided, if desired.

Combinations of the above-described features (i.e., the via holes 22, the physical feature 25, the plural features 27, 28, 29, 30, and the hole or holes 31) may also be used to effectively decrease the amount of current which must be supplied by the circuitry 11 for purposes of blowing the fuse 10.

The implementation of the present invention which is selected for use in a particular application will depend upon the configuration of the integrated circuit which is being formed, the materials which are used to form the various layers of the integrated circuit, and the processes which are used to manufacture the integrated circuit. In general, a fuse made by the "rules" of a given fabrication process will have a fixed width and will require a minimum amount of energy to be operated (i.e., blown). This requires a correspondingly (i.e., minimum) sized transistor to blow the fuse, in turn limiting the degree of integration that is possible. In accordance with the present invention, one or more mask features placed according to the rules of the manufacturing process are used to lower the energy required to blow the fuse open. It is important that the selected feature or features conform to the rules of the manufacturing process so that the resulting integrated circuits can be reliably checked and are repeatable in terms of their manufacture, to maintain the required yield while lowering the energy required to operate the fuse or fuses associated with the manufactured article.

Implementation of the topological features of the present invention is well suited to the various processes which can be used to manufacture integrated circuits (e.g., standard CMOS processing), and the resulting fuse (or fuses) is more reliably blown when such an operation becomes desirable. In particular, it is considered less likely that portions of the fuse will become reattached, over time, a phenomenon which was found to occur previously, following the use of conventional techniques for blowing programmable fuses.

The present invention is particularly useful for applications in which the fuses are to be blown using on-chip circuitry under digital control. This would include applications in secure data encryption including, but not limited to, digital cellular phones, digital pagers, computer communications, and public telephone communications. The foregoing processes could also be used to provide customers with a way to access the internal operations of an integrated circuit, while denying access to anyone without the correct access codes. There are also corresponding applications in digital memory correction, ADC and DAC correction, the course tuning of filters, and bandgap reference correction. The improvements of the present invention will find use in any of a number of products and applications.

It will therefore be understood that various changes in the details, materials and arrangement of parts which have been herein described and illustrated in order to explain the nature of this invention may be made by those skilled in the art within the principle and scope of the invention as expressed in the following claims.

What is claimed is:

1. A circuit associated with an integrated circuit, comprising:

a fuse formed as a fuse layer of the integrated circuit, wherein the fuse layer is formed of a material which requires a set blowing current for causing the fuse to open;

a switch in series combination with the fuse, wherein the switch is formed on the integrated circuit and wherein the series combination of the switch and the fuse is connected between a power source and ground, and a topological feature in contact with the fuse, and associated with the integrated circuit, wherein the fuse has a shape which is modified by the topological feature and the topological feature combines with the fuse layer to decrease the set blowing current for causing the fuse to open.

2. The circuit of claim 1 wherein the fuse material is a metal.

3. The circuit of claim 1 wherein the switch is a transistor element.

4. The circuit of claim 1, wherein the topological feature is formed by an opening which penetrates portions of the fuse layer.

5. The circuit of claim 4, wherein the fuse includes a narrowed portion defined by the opening which penetrates portions of the fuse layer.

6. The circuit of claim 4, wherein a plurality of openings penetrate the fuse layer.

7. The circuit of claim 1, wherein the topological feature is formed as a layer positioned beneath the fuse layer, the topological feature urging a portion of the fuse layer thereby modifying the portion of the fuse by a thinning of the fuse layer over an edge of the layer positioned beneath the fuse layer.

8. The circuit of claim 1, wherein the topological feature is formed as a plurality of layers arranged to provide a ravine, the ravine receiving a portion of the fuse layer so that a portion of the fuse received by the ravine is narrower than the remaining portions of the fuse.

9. The circuit of claim 1 wherein the fuse layer has a characteristic resistance, and wherein the modified shape of the fuse increases the characteristic resistance of the fuse layer.

10. The circuit of claim 1 wherein the fuse layer has a characteristic energy level for causing the fuse to open, and wherein the topological feature reduces the characteristic energy level required to cause the fuse to open.

11. The circuit of claim 10, wherein the topological feature is formed by an opening in a layer of the integrated circuit, the opening penetrating the fuse layer.

12. A method for manufacturing an integrated circuit including a fuse for use in adjusting an operative feature of the integrated circuit, comprising the steps of:

forming a fuse layer on a base layer of the integrated circuit, wherein the fuse layer is formed of a material which requires a set blowing current for causing the fuse to open;

forming a topological feature in contact with the fuse layer and associated with the integrated circuit, wherein the topological feature combines with the fuse layer to decrease the set blowing current for causing the fuse to open and the fuse layer forms a fuse having a defined shape; and modifying the shape of the fuse with the topological feature.

13. The method of claim 12 which further comprises the steps of positioning a via hole in contact with the fuse layer, and narrowing portions of the fuse responsive to the positioning of the via hole.

14. The method of claim 13 wherein a plurality of via holes are positioned in contact with the fuse layer.

15. The method of claim 12, further comprising the step of positioning the topological feature beneath the fuse layer, urging a portion of the fuse layer thereby modifying the portion of the fuse by a thing of the fuse layer over an edge of the topological feature positioned beneath the fuse layer.

16. The method of claim 12, further comprising the step of forming the topological feature as a plurality of layers arranged to provide a ravine, the ravine receiving a portion of the fuse layer, causing a portion of the fuse received by the ravine to become narrower than the remaining portions of the fuse.

17. The method of claim 12 wherein the fuse layer has a characteristic resistance, and which further comprises the step of increasing the characteristic resistance of the fuse layer by modifying the shape of the fuse.

18. The method of claim 12 wherein the fuse layer has a characteristic energy level for causing the fuse to open, and which further comprises the step of forming an open region in a layer of the integrated circuit in contact with the fuse layer, for reducing the characteristic energy level for causing the fuse to open.

19. A method for manufacturing an integrated circuit including a fuse for use in adjusting an operative feature of the integrated circuit, comprising the steps of:

forming a fuse layer on a base layer of the integrated circuit, wherein the fuse layer is formed of a material which requires a set blowing current for causing the fuse to open;

forming a topological feature in contact with the fuse layer and associated with the integrated circuit, wherein the fuse has a shape which is modified by the topological feature and the topological feature combines with the fuse layer to decrease the set blowing current for causing the fuse to open; and forming a switch in series combination with the fuse, wherein the switch is formed on the integrated circuit and wherein the series combination of the switch and the fuse is connected between a power source and ground.

20. The method of claim 19 which further comprises the step of operating the switch to cause a current to flow through the series combination which is sufficient to open the fuse.

21. The method of claim 19, wherein the manufacturing method is performed according to a predetermined set of design rules associated with a predetermined fabrication process.

22. A method for adjusting an operative feature associated with al integrated circuit, comprising the steps of:

providing the integrated circuit with a fuse associated with the integrated circuit so that the operative feature can be switched from a first state when the fuse is closed to a second state when the fuse is opened, wherein the fuse is formed of a material which requires a set blowing current for causing the fuse to open, a switch coupled with the fuse so that the fuse can be connected between a power source and ground, and a topological feature in contact with the fuse, and associated with the integrated circuit.

modifying a shape of the fuse when the topological feature is combined with the fuse to decrease the set blowing current for causing the fuse to open; and selectively operating the switch to cause the operative feature to assume either the first state or the second state.

23. The method of claim 22 which further comprises the step of operating the switch to open the fuse and cause the operative feature to assume the second state.

24. The method of claim 22 which further comprises the step of sensing whether the fuse is opened or closed.

* * * * *